United States Patent [19]
Okumura

[11] Patent Number: 5,437,733
[45] Date of Patent: Aug. 1, 1995

[54] METHOD AND APPARATUS FOR TREATING A SUBSTRATE

[75] Inventor: Katsuya Okumura, Yokohama, Japan

[73] Assignee: Kabushiki Kaisha Toshiba, Kawasaki, Japan

[21] Appl. No.: 778,370

[22] Filed: Oct. 17, 1991

[30] Foreign Application Priority Data

Oct. 18, 1990 [JP] Japan ................................ 2-277677

[51] Int. Cl.⁶ ............................................. B08B 3/04
[52] U.S. Cl. ........................................ 134/34; 134/2; 134/48; 134/117; 134/122 R; 204/1.11; 204/194; 430/434; 216/23; 216/99; 156/662.1
[58] Field of Search .................. 134/11, 34, 24, 48, 134/122 R, 117; 156/625, 662; 204/1.11, 194; 430/434

[56] References Cited

U.S. PATENT DOCUMENTS

| | | | |
|---|---|---|---|
| 4,187,868 | 2/1980 | Rudolph | 134/34 |
| 4,519,846 | 5/1985 | Aigo | 134/199 |
| 4,749,440 | 6/1988 | Blackwood et al. | 134/3 |
| 4,857,211 | 8/1989 | Nineuil et al. | 134/34 |
| 4,997,490 | 3/1991 | Vetter et al. | 134/95 |

*Primary Examiner*—Anthony McFarlane
*Attorney, Agent, or Firm*—Finnegan, Henderson, Farabow, Garrett & Dunner

[57] ABSTRACT

A plane of a treatment liquid holder having a number of through holes faces a treatment surface of a substrate. A treatment liquid is held between the treatment surface and the liquid holder by utilizing a surface tension of the treatment liquid. Since the treatment liquid is applied only to the treatment surface, an extremely small amount of treatment liquid suffices for the treatment. In addition, since a fresh treatment liquid can be used in every treatment, cross-contamination is suppressed and the treatment can be performed with safety at a low cost.

31 Claims, 7 Drawing Sheets

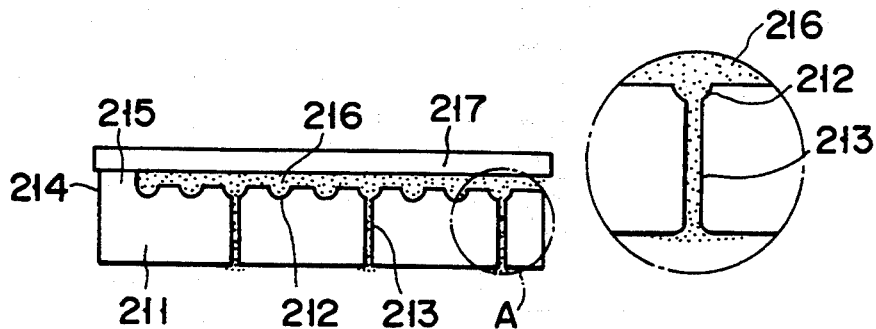
F I G. 6A    F I G. 6B
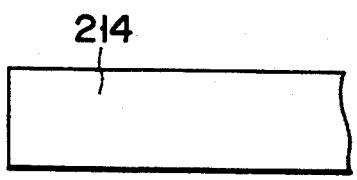
F I G. 7A
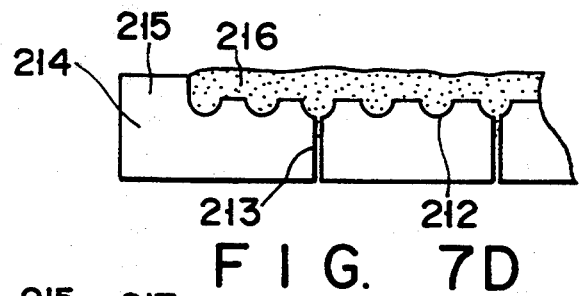
F I G. 7D
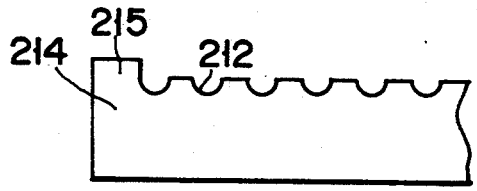
F I G. 7B
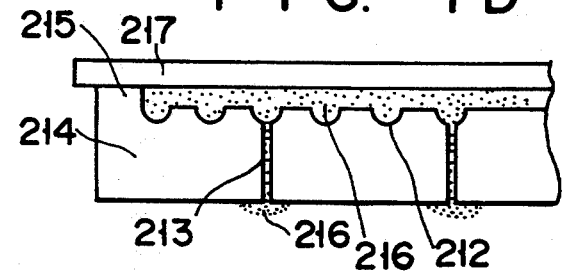
F I G. 7E
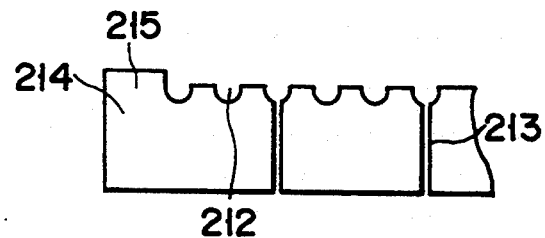
F I G. 7C

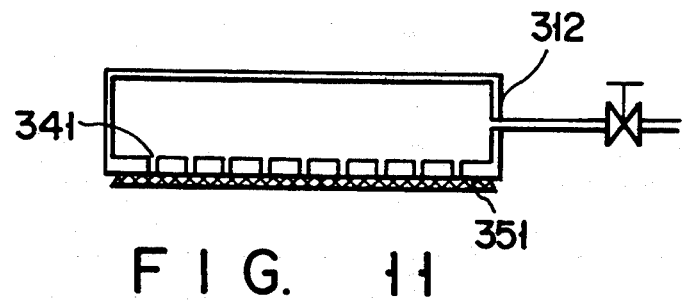
F I G. 11
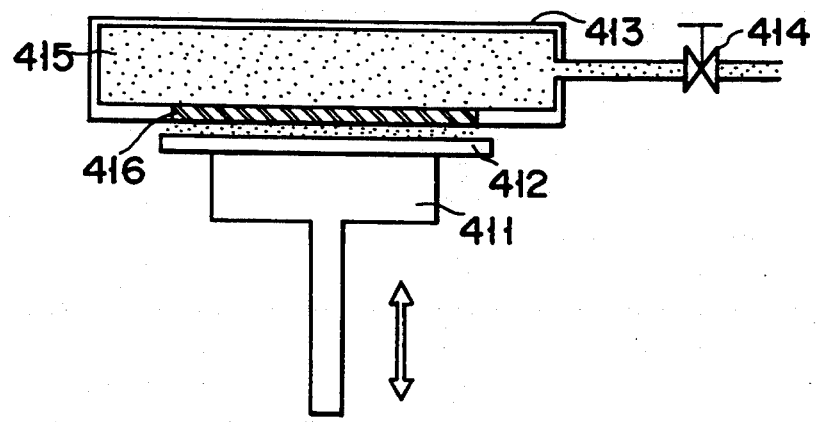
F I G. 12
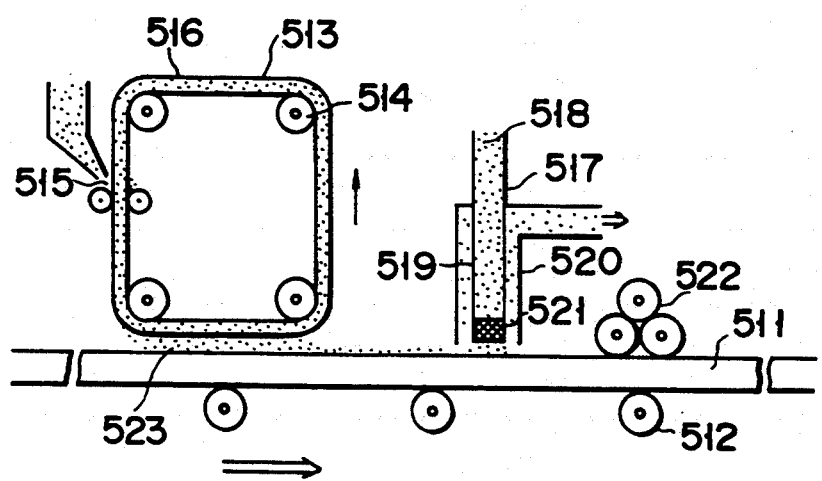
F I G. 13

METHOD AND APPARATUS FOR TREATING A SUBSTRATE

BACKGROUND OF THE INVENTION

1. Field of the Invention

The present invention relates to a method of treating a semiconductor substrate with fluid (especially with liquid) and an apparatus for the same and, more particularly, to a method of treating only one surface of a flat substrate for use in a semiconductor device or a liquid crystal display device and an apparatus for the same.

2. Description of the Related Art

As steps of treating a semiconductor substrate (silicon wafer) with chemicals, there are various steps such as photoresist applying, etching, cleaning, photoresist removing, developing, plating, etc. A conventional steps of treating a silicon wafer with chemicals will be described in detail.

FIG. 1 is a crosssectional view of a treatment apparatus wherein a silicon wafer is immersed in a treatment tub 11 to be treated. In case of wafer cleaning or resist removing, a treatment liquid 12 is composed of $H_2SO_4$ and $H_2O_2$ mixed in a ratio of 10:1, for example, and is filled in a treatment tub 11 by a total amount of 25 l. The treatment tub 11 is made of quartz or the like. The treatment liquid 12 is heated by a lamp heater 13 to about 150° C. A plurality of, for example, 25 sheets of silicon wafers 14, i.e, substrates to be treated, on which resist patterns each of a diameter of 150 mm, for example, are formed are held in a wafer holder 15 and they are immersed in the treatment liquid 12. The cleaning step and the resist removing step are completed by immersing the wafers 14 in the treatment liquid 12 for about 15 minutes. About 500 sheets of wafers 14 can be treated with the treatment liquid 12 of 25 l.

In an etching step of a glass layer, an ammonium fluoride ($NH_4F$) or a diluted hydrofluoric acid (HF) is used as the treatment liquid 12. In an etching step of a silicon layer, a solution of organic alkali is used as the treatment liquid 12. In order to remove an oxide film formed on the rear surface of the silicon wafer by an etching step, the wafer 14 is immersed in the treatment tub 11 with the main surface of the wafer being entirely covered by the resist. In addition, $SiO_2$ can be deposited on a wafer by using the tub 11 as shown in FIG. 1, in which Al is dissolved in a saturated solution of $H_2SiF_6$. When a liquid crystal display apparatus is manufactured, a larger chemical treatment tub 11 is used since larger wafers are used.

FIG. 2 is a crosssectional view showing an apparatus for plating a silicon wafer. A plating of a silicon wafer with Au bumps for use in TAB (Tape Automated Bump) process will be described with reference to FIG. 2. A plating solution tub 21 is filled with an Au plating solution 22 and heated to 60° to 70° C. A wafer 23 and an electrode 24 are placed opposite each other in the Au plating solution 22. A direct power source 25 supplies a current to plate the wafer 23. A power feeding portion 26 is provided at an end of the wafer 23.

Next, a deposition treatment on the silicon wafer will be described with reference to FIG. 3. To increase adhesion force between a positive photoresist and a wafer 33, a deposition treatment using a saline coupling agent such as HMDS (hexamethylenedisilane) is generally performed before the resist is applied to the wafer. In the deposition treatment, an HMDS liquid 32 and a wafer 33 are placed in a vessel 31 and then the vessel 31 is sealed hermetically. The HMDS liquid 32 is heated by a heating means 34 to be vaporized, vapor 35 of the HMDS liquid 32 forms an HMDS film on the wafer 33. In this way, the treatment of the wafer with coupling agent is completed.

FIG. 4 is a crosssectional view showing a treatment apparatus using a spray nozzle. First, a method of developing a positive photoresist will be described. A silicon wafer 41 is mounted on a rotary chuck 42 and fixed thereto. In a development treatment, the wafer 41 is rotated to be developed while a treatment liquid i.e., a developer, is being sprayed on the pattern-exposed resist on the wafer 41 by a spray nozzle 44. Otherwise, a developer may be dropped from the nozzle 44 and deposited on the wafer 41 by means of a surface tension, to develop the photoresist in a static state. Next, a method of applying photoresist will be described. In FIG. 4, a treatment liquid 43, i.e., photoresist, is dropped from the nozzle 44 instead of a developer and deposited on the wafer 41. Thereafter, the wafer 41 is rotated by the rotary chuck 42. As a result, superfluous photoresist is scattered and a photoresist layer of a desired thickness is applied to the wafer 41.

Regarding the treatments of the wafer 14 immersed in the chemical treatment tub 11, as shown in FIG. 1, the same treatment liquid 12 is always used several times since a great amount of the treatment liquid 12 is required. If the wafer 14 or the wafer holder 15 is contaminated, the contaminant is dissolved into the treatment liquid 12. Thus if the contaminated treatment liquid 12 is used to treat another wafer 14, then the wafer 14 is also contaminated. This is called cross-contamination. The treatment liquid 12 should be changed for every treatment to prevent this contamination. Hence this method is impractical because of its high cost. Moreover, even if the treatment liquid 12 is changed for every treatment, contaminant on the rear surface of the wafer 14 may be attached to the main surface of the wafer 14. Hence, it is impossible to prevent the cross-contamination. In addition, a serious accident may occur if the treatment tub 11 is damaged since a great amount of the treatment liquid 12 is used in the treatment tub 11. Thus, the method has a problem in safely.

In the plating of the wafer 23, as shown in FIG. 2, the rear surface of the silicon wafer 23 must be covered by the resist or the like, so that it is not plated. For this purpose, additional treatment steps are required. Moreover, the power feeding portion 26 is plated with Au since it is immersed in the plating solution 22 and therefore it is impossible to successively treat a number of wafers 23. In addition, since a great amount of the plating solution 22 must be used, a number of wafers 23 may be treated at a time to save cost. In such case the cross-contamination is unavoidable as in the case of the treatment shown in FIG. 1. Depending on the cause of the contamination, a quality of the plating cannot be duplicated.

In the deposition treatment shown in FIG. 3, the HMDS film is formed unnecessarily on the rear surface of the wafer 33. In the subsequent steps, dusts may be adhered to the HMDS film on the rear surface, resulting in occurrence of particles or contamination. Moreover, the HMDS may be deposited thickly on the inner wall of the closed vessel 31. Thus the thick HMDS film may peeled off to cause the particles. Moreover, when the whole space of the vessel 31 is filled with the HMDS vapor, it is difficult to make the HMDS concentration in the vessel 31 uniform. Therefore, the thicknesses of the HMDS films formed on the wafer 33 may be varied.

In the development treatment by the apparatus shown in FIG. 4, when the development is performed with the developer sprayed by the spray nozzle 44 on the rotating wafer 41, a radial nonuniformity in the developer is occurred. Further, in case the developer is dropped from the nozzle 44 on the stationary wafer 41, the nonuniformity in the developer occurs less. However, if the developer spreads slowly on the surface of the wafer 41, another nonuniformity in the developer may easily occur. For this reason, it is desirable that the developer be spread on the surface of the wafer 41 as quickly as possible. However, if the developer is spread too quickly, the surface tension of the developer is lost, and then the developer cannot stay on the wafer 41. Thus the developer cannot be held on the surface of the wafer 41. Moreover, if the wafer is not placed horizontally, or vibrated or swayed due to wind, mechanical vibration, etc, the developer may also overflow the wafer 41. Moreover, when the diameter of the wafer 41 is as large as 200 mm or more, it is difficult to hold the developer on the wafer only by the surface tension.

In the photoresist applying treatment by the apparatus shown in FIG. 4, when the wafer 41 is rotated to scatter the superfluous resist, the solvent in the resist volatilizes. As a result, the viscosity of the resist increases. Thus, if the solvent volatility speed do not balance with the resist scattering speed, the resist film may undulate with the thickness thereof being greatly varied. This is called striation. To minimize the striation, a greater amount of the resist 43 is deposited on the wafer 41, or the rotation speed or acceleration of the wafer 41 is increased, for example. However, the striation cannot be overcome by these measures only as wafers 41 have become lager and larger.

SUMMARY OF THE INVENTION

It is an object of the present invention to provide a method of treating a substrate with a small amount of a treatment solution efficiently with safety and without an influence of cross-contamination and an apparatus for the same.

A method of treating a substrate of the present invention comprises the steps of placing treatment liquid holding means having a number of through holes in parallel with a treatment surface of a substrate; adjusting the distance between said treatment surface of the substrate and a surface of said treatment liquid holding means which faces said treatment surface, thereby forming a space therebetween; and filling the space with a treatment liquid and keeping the treatment liquid only on said treatment surface of the substrate by the surface tension of the treatment liquid.

An apparatus of treating a substrate of the present invention comprises: means for holding the substrate to be treated; means, a plane of which faces a treatment surface of said substrate such that a space is formed therebetween, for causing a treatment liquid to be held only on the treatment surface by utilizing surface tension of the treatment liquid; and means for supplying the treatment liquid to said space.

According to the present invention, an extremely small amount of a treatment solution suffices for the treatment since the treatment solution can be applied to only the treated surface of the substrate. In addition, the cross-contamination can be perfectly suppressed since a fresh treatment solution can be used in every treatment instead of the used treatment solution. The treatment can also be performed with safety at a low cost.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6A is a crosssectional view schematically showing a substrate treatment apparatus according to a second embodiment of the present invention;

FIG. 6B is an enlarged crosssectional view showing a portion A shown in FIG. 6A;

FIGS. 7A to 7E are crosssectional views for explaining the substrate treatment apparatus shown in FIG. 6A;

FIG. 11 is a crosssectional view schematically showing a substrate treatment apparatus according to a sixth embodiment of the present invention;

FIG. 12 is a crosssectional view schematically showing a substrate treatment apparatus according to a seventh embodiment of the present invention; and FIG. 13 is a crosssectional view schematically showing a substrate treatment apparatus according to a eighth embodiment of the present invention.

DETAILED DESCRIPTION OF THE PREFERRED EMBODIMENTS

Methods and apparatuses for treating a substrate according to embodiments of the present invention will be described in detail with reference to the accompanying drawings.

Figure 1:
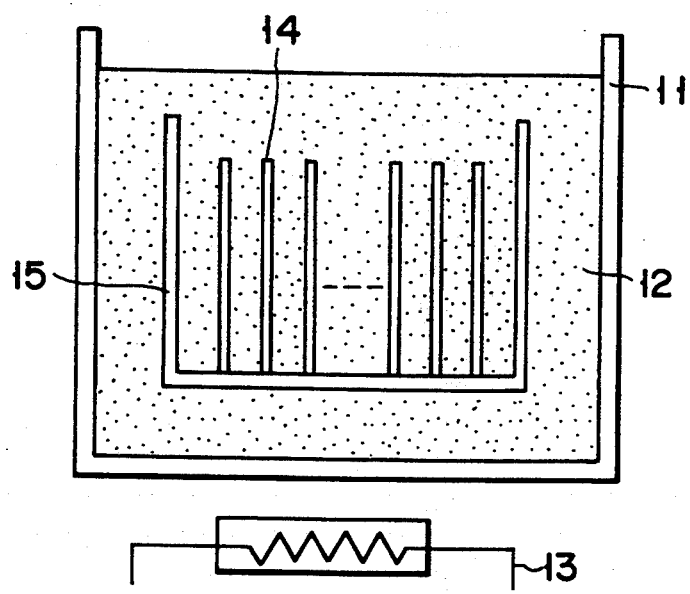
FIG. 1 is a crosssectional view schematically showing a conventional treatment apparatus for treating a silicon wafer, wherein the silicon wafer is immersed in a treatment tub.
Figure 2:
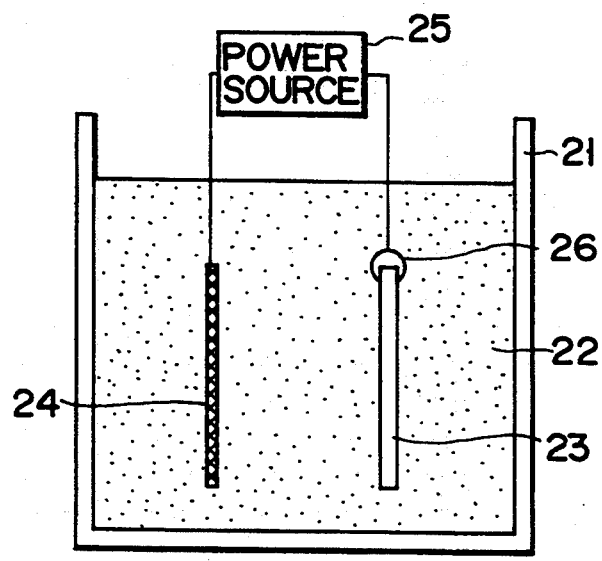
FIG. 2 is a crosssectional view schematically showing a conventional treatment apparatus for plating a silicon wafer.
Figure 3:
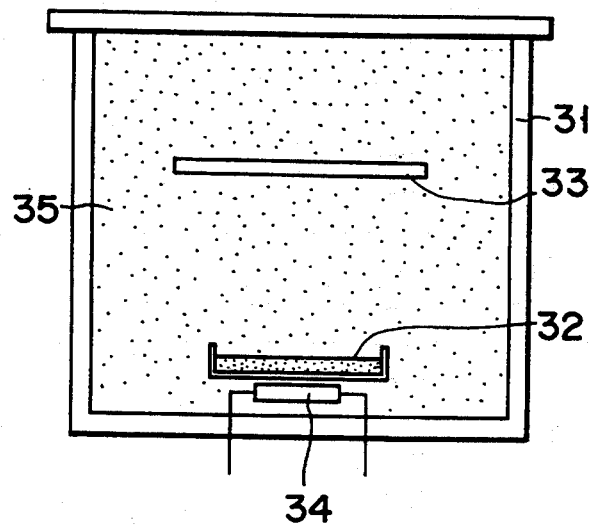
FIG. 3 is a crosssectional view schematically showing a conventional treatment apparatus for deposition treatment of a silicon wafer.
Figure 4:
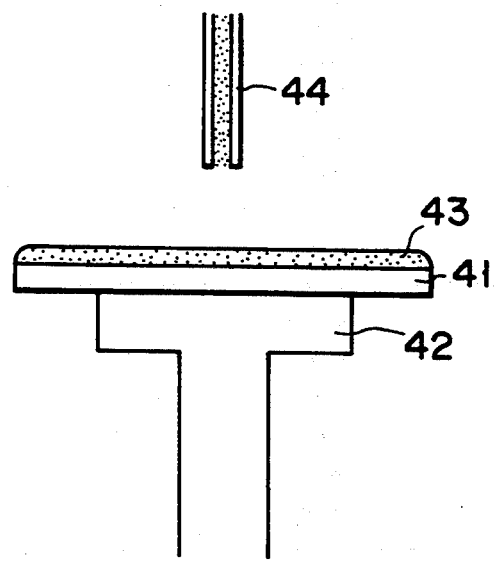
FIG. 4 is a crosssectional view schematically showing a conventional treatment apparatus for treating a silicon wafer by means of a spray nozzle.
Figure 5A:
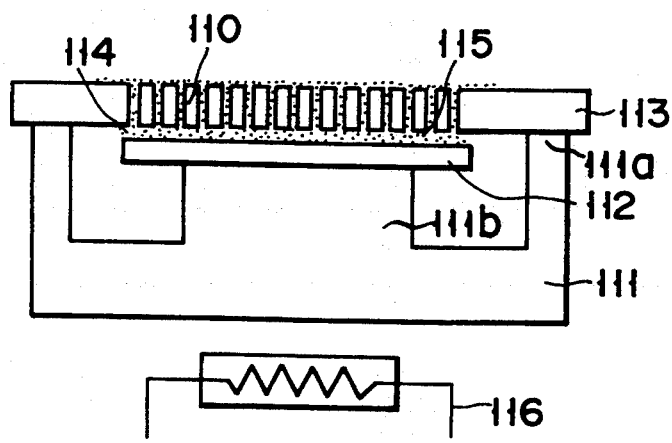
FIG. 5A is a crosssectional view schematically showing a first embodiment of a substrate treatment apparatus according to the present invention.

FIG. 5A is a crosssectional view schematically showing a substrate treatment apparatus according to a first embodiment of the present invention. The substrate treatment apparatus of the first embodiment has been developed to treat the main surface (upper surface) of the substrate. A substrate holder 111 is formed of quartz and constituted by a peripheral portion 111a and a central supporting portion 111b which is lower than the peripheral portion 111a. A silicon wafer 112 having a diameter of, for example, 150 mm is mounted on the supporting portion 111b of the substrate holder 111. A treatment liquid holder 113 is mounted on the peripheral portion 111a thereby defining an interval 114 between holder 113 and wafer 112. The holder 113 has through holes 110. The holder 113 is immersed in a treatment liquid 115 and the through holes 110 are filled with the liquid 115.

Figure 5B:
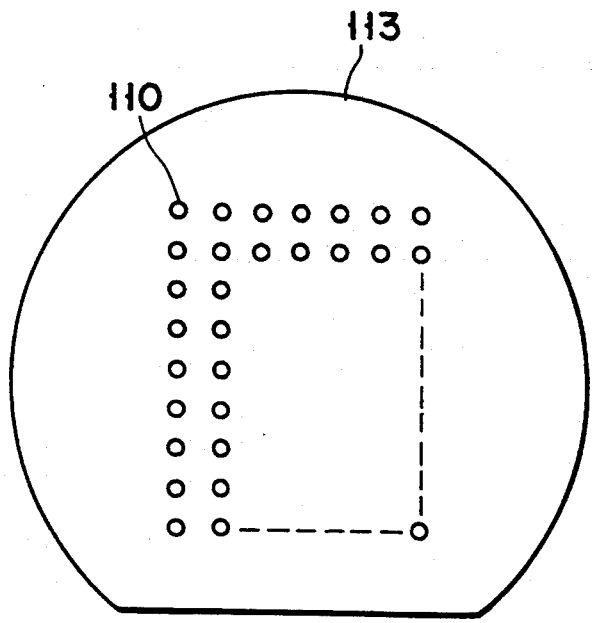
FIG. 5B is a plan view schematically showing a treatment solution holder 113 in FIG. 5A.
Figure 5C:
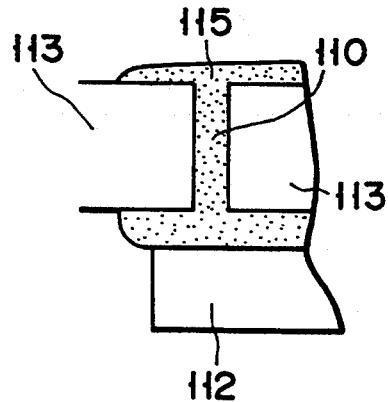
FIG. 5C is an enlarged crosssectional view showing a portion of the holder shown in FIG. 5B.

The treatment liquid holder 113 is made of a carbon disk, for example, having a diameter of 170 mm and a thickness of 2 mm. FIG. 5B is a plan view of treatment liquid holder 113. Through holes 110 having a diameter of 1.5 mm are formed at intervals of 3 mm on a substantially overall portion of a circle having a diameter of 150 mm in the carbon disk. The through holes 110 are not provided on an area of the holder 113 corresponding to an orientation flat (OF) portion of the wafer 112. As shown in FIG. 5A, the difference between the heights of the peripheral portion 111a and the supporting portion 111b of the substrate holder 111 is determined in accordance with the thickness of the wafer 112, the surface tension of the treatment liquid 115 and the like, such that the interval 114 of, for example, 0.5 mm is formed between the holder 113 and the wafer 112, as is shown in FIG. 5C, which is an enlarged crosssectional showing a portion of the holder shown in FIG. 5B. Hence, the treatment liquid 115 is held in the interval 114 and does not overflow the wafer 112. The interval 114 can be changed in accordance with the viscosity of the treatment liquid 115. For example, if the liquid 115 is water the interval 114 is about 0.5 mm, and if the liquid is a solution of a high viscosity such as sulfuric acid the interval 114 is about 1 mm.

In the apparatus shown in FIGS. 5A, 5B and 5C a sufficient amount of treatment liquid 115 can be held in the space between the holder 113 and the wafer 112 since the holder 113 has a number of through holes 110. Moreover, the holder 113 can be easily removed from the wafer 112 since air can flow into the interval through the through holes 110 by lifting up the holder 113. If the holder 113 may be made of porous material, the same effect can be obtained. Needless to say, the holder 113 should be formed of a material which is not deteriorated by the treatment liquid 115. Further, it is desirable that the surfaces of the holder 113 have been processed with Teflon or the like to increase both the surface tension of the liquid 115 and the chemical resistance of the holder 113. If possible, the side surface of the wafer 112 are also processed in the same manner. The holder 113 may be formed of knit of carbon or glass fibers, or paper-like material. In such case the holder 113 can be removed from the wafer 112 much easier since it is bendable. Furthermore, the holder 113 may be made of unbendable sticks connected by threads or suitable coupling means so as to form a raft-like member.

A treatment of removing resist or cleaning a wafer by means of the apparatus of FIG. 5A using a mixed solution of $H_2SO_4$ and $H_2O_2$ as a treatment liquid 115 will now be described. $H_2OS_4$ and $H_2O_2$ are mixed in the ratio 10:1. Resist is deposited on the main surface, i.e., the upper surface of the wafer 112 to which the holder 113 is opposed. The holder 113 is placed on the wafer 112 to hold a treatment liquid 115. Thus lamp heater 116 positioned below the substrate holder 111 is turned on, thereby heating the holder 113 made of carbon, which easily absorbs infrared radiation. As a result, the treatment liquid 115 is heated quickly and the resist is removed from the wafer 112 at a high rate. The temperature of the heater 116 in this step is, for example, 150° to 200° C. The resist removing treatment is completed within 2 to 3 minutes. After the treatment is completed, the holder 113 is lifted up and the wafer 112 is removed from the substrate holder 111 and another wafer to be treated is placed thereon. Then, the above-described steps are repeated. Instead of mounting the holder 113 immersed by the treatment liquid 115 on the wafer 112, the treatment liquid 115 may be dropped on the holder 113 which has been placed on the wafer 112. If the contaminant generated when the resist is removed is adhered to the holder 113, the cross-contamination may occur. To prevent this, the holder 113 may be cleaned, if necessary. In this case, the process will not delay if a plurality of holders 113 are used sequentially.

A treatment of removing an $Si_3N_4$ film formed on the wafer 112 by means of the apparatus of FIG. 5A using a heated phosphoric acid ($H_3PO_4$) as the treatment liquid 115 will then be described. The treatment process is the same as the resist removing treatment as described above. However, according to the preferred embodiments of the present invention, the treatment can be performed with safety since a very small amount of phosphoric acid is used. In addition, the $Si_3N_4$ film can be removed from the wafer 112 at a cost lower than that required in a conventional treatment method using plasma. Moreover, the wafer 112 is not affected and damaged by the treatment liquid 115 at all.

The apparatus shown in FIG. 5A is also applicable to etching an $SiO_2$ film with an ammonium fluoride ($NH_4F$) or a diluted hydrofluoric acid (HF), or to etching silicon with an organic alkali solution. In these treatments, an SiC film formed by a high-purity CVD method is used as the holder 113.

In the first embodiment shown in FIG. 5A, the treatment liquid holder 113 has an area entirely covering the silicon wafer 112. However, the holder 113 may be constructed to have an area covering only a portion of the silicon wafer 112. In this case, the overall surface of the wafer 112 can be covered by sliding the holder 113 over the wafer 112.

FIG. 6A is a crosssectional view schematically showing a substrate treatment apparatus 211 according to a second embodiment of the present invention. FIG. 6A shows holder 214, spot facing holes (blind holes) 212, through holes 213, projections 215, treatment liquid 216, and wafer 217. FIG. 6B is an enlarged crosssectional view showing a portion A shown in FIG. 6A. The apparatus of the second embodiment is developed to treat the rear surface, i.e., lower surface of a wafer 217.

A treatment liquid holder 214 is constituted by a carbon plate having a diameter of 150 mm and a thickness of 10 mm (FIG. 7A). Spot facing holes (blind holes) 212 having a diameter of 2 mm and a depth of 2 mm are formed in matrix at a 4 mm pitch on a substantially entire portion of the holder 214 (FIG. 7B). In the holder 214, through holes 213 of a diameter of 1 mm are formed in about 30% of all the spot facing holes 212 at their bottoms (FIG. 7C). Projections 215 for supporting the wafer 217 are formed at intervals in the peripheral portion of the holder 214. The height of the projections 215 is determined in accordance with the amount of the treatment liquid 216 required for treating the wafer 217, the surface tension of the liquid 216 and the like. For example, three projections 215 of 1.5 mm height are formed on the peripheral portion of the holder 214. To increase the surface tension of the liquid 216 on the holder 214, an SiC film is deposited about 50 μm thickness entirely on the holder 214 by CVD method.

Now, a treatment of removing an oxide film formed on the rear surface of the wafer 217 by means of the apparatus of FIG. 6A will now be described. A solution 216 of the ammonium fluoride (NH$_4$F) is dropped on the spot facing holes 212 of the treatment liquid holder 214 so as to slightly swell thereon (FIG. 7D). Next, the wafer 217 is placed on the projections 215 such that the treatment surface i.e., the rear surface of the wafer 217 is brought into contact with the NH$_4$F solution 216 (FIG. 7E). The NH$_4$F solution 216 thus extends over the entire rear surface of the wafer, as is shown in FIG. 7E. Although the treatment liquid 216 enters the through holes 213 while it is dripping in the spot facing holes 212, it does not leak below owing to the surface tension. However, it is desirable that the amount of drip should be adjusted such that the treatment liquid 216 does not leak out of the through holes 213 when the rear surface of the wafer 217 is brought into contact with the treatment liquid 216. It is also desirable that the wafer 217 be inclined to prevent air from entering between the wafer 217 and the treatment liquid 216, so that a bubble may not be formed. When the treatment is completed and the wafer 127 is lifted up, since air can flow into the space between the wafer 217 and the holder 214 through the through holes 213, the wafer 217 can be ripped off from the holder 214 relatively easily.

Figure 8:
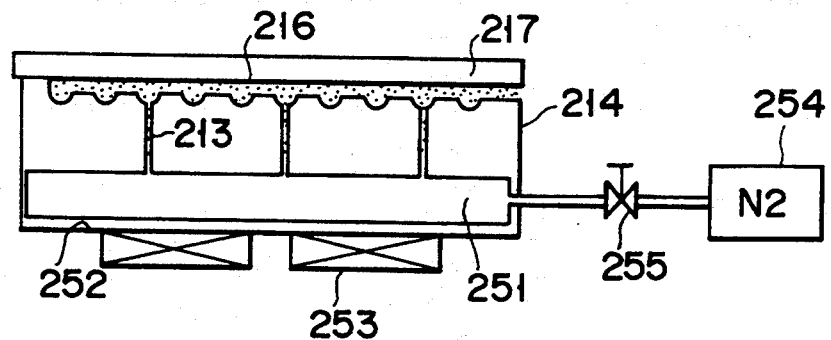
FIG. 8 is a crosssectional view schematically showing a substrate treatment apparatus according to a third embodiment of the present invention.

FIG. 8 is a crosssectional view schematically showing a substrate treatment apparatus according to a third embodiment of the present invention. In the third embodiment, a treatment liquid holder 214 is the same as that of the second embodiment shown in FIG. 6A. A closed space 251 communicating with a space between the holder 214 and the wafer 217 by the through holes 213 is provided beneath the holder 214. A pressure control mechanism for controlling the pressure in the closed space 251 is connected to the space 251. The pressure control mechanism is constituted by, for example, an N$_2$ cylinder 254 and a pressure control valve 255. The pressure control mechanism can be utilized for controlling the pressure in the closed space 251 to bring the treatment liquid 216 into contact with the treatment surface of the wafer 217, or increasing or decreasing the pressure in the space 251 to apply variations to the treatment liquid 216 so that the spread of the treatment liquid 216 can be accelerated. Furthermore, the pressure control mechanism can be utilized for controlling the pressure in the space 215 when the wafer 217 is lifted up from the holder 214, so that gas can easily flow through the through holes 213. Otherwise, a treatment liquid supplying mechanism may be connected to the closed space 251, and the space 251 may be filled with a treatment liquid 216. In this case, the liquid 216 is supplied to the spot facing holes through the through holes 213, and the used treatment liquid 216 is collected to the supplying mechanism after completion of the treatment. An ultrasonic oscillator 253 for vibrating to the treatment liquid 216 may be provided on the bottom 252 of the closed space 251, if necessary. Moreover, a temperature control mechanism (not shown) may be provided for controlling both temperatures of the treatment liquid 216 and the wafer 217.

Figure 9:
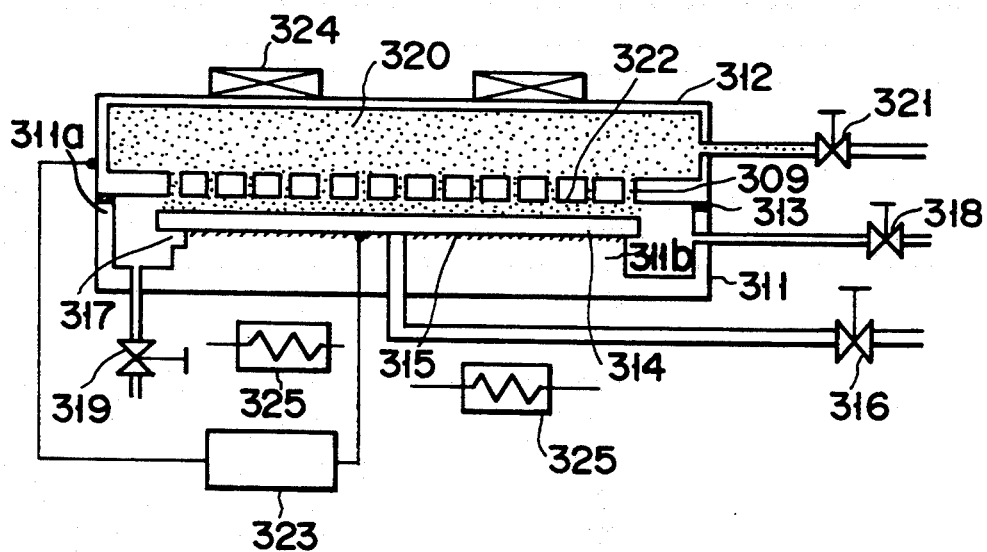
FIG. 9 is a crosssectional view schematically showing a substrate treatment apparatus according to a fourth embodiment of the present invention.

FIG. 9 is a crosssectional view showing a substrate treatment apparatus according to a fourth embodiment of the present invention. The apparatus of the fourth embodiment is developed for use in plating a wafer. A substrate holding vessel 311 comprises an outer peripheral portion 311a for hermetically sealing the vessel 311 and a trapezoid supporting portion 311b formed at its center. The vessel 311 is formed of, for example, quartz having a diameter of 175 mm. The difference between the heights of the outer peripheral portion 311a and the supporting portion 311b is determined in accordance with the thickness of a wafer 314 to be treated, the surface tension of a plating solution 322 and the like. Plating electrodes 315 are provided on the surface of the supporting portion 311b. A treatment liquid holder 312 has substantially the same diameter as the peripheral portion 311a of the substrate holding vessel 311, and it is connected to the peripheral portion 311a with an O ring 313 interposed therebetween thus forming a closed space. The holder 312 is made of, for example, stainless steel, and includes a space 320 for holding a predetermined amount of a treatment liquid 322. The lower surface of the holder 312, which faces the wafer 314, is processed with Pt, and all the other surfaces thereof is processed with Teflon to increase the chemical resistance with respect to the plating solution 322. A number of through holes 309 are formed in the bottom of the holder 312. A gas supplying mechanism 318 and a drain (gas exhausting) mechanism 319 are connected to the vessel 311 to control the pressure therein. A treatment liquid supplying mechanism 321 communicates with the space 320 in the holder 312 and controls the pressure of the treatment liquid in the space 320. A direct current power source 323 is connected to the holder 312 and the electrodes 315 adhered to the supporting portion 311b. An ultrasonic oscillator 324 is mounted on the upper surface of the holder 312. A heating lamp 325 is placed beneath the vessel 311. A vacuum chuck mechanism 316 may be connected to the vessel 311 to ensure the contact between the wafer 314 and the electrodes 315. In addition, notches or slits 317 may be formed in the supporting portion 311b so that the wafer 314 can be easily mounted on or removed from the supporting portion 311b.

A treatment of plating a silicon wafer 314 with an Au bump for use in the TAB process by means of the apparatus of FIG. 9 will now be described. First, a wafer 314 is placed on the supporting portion 311b of the substrate holding vessel 311. Next, a plating solution 322 is supplied from a plating solution supplying mechanism 321 to a space between the wafer 314 and the holder 312 via the through holes 309, while the pressure in the vessel 311 and the pressure of the treatment wafer 314 is balanced. The plating solution 322 does not overflow the wafer 314 owing to the surface tension of the solution 322 on the holder 312 and the wafer 314, as shown in FIG. 9. A direct current of a predetermined amount is supplied from the direct current power source 323 to the holder 312 and the electrodes 315 for a predetermined period of time. As a result, the wafer 314 is plated with Au. At that time, it is possible to apply ultrasonic vibrations to the plating solution 322 by means of the ultrasonic oscillator 324, thereby facilitating the circulation of the plating solution 322. Moreover, during the plating process, the plating solution 322 existing in the space between the holder 322 and the wafer 314 can be replaced by the solution stored in the space 320 by means of the plating solution supplying mechanism 321. Furthermore, if necessary, the wafer 314 may be heated by the heating lamp 325 and/or a heated plating solution 322 may be supplied to the vessel.

According to the fourth embodiment, since the rear (lower) surface of the wafer 314 is not contacted with the plating solution 322, it is not stained by contaminant in the solution and the electrodes are not plated with Au, unlike in the conventional treatment apparatus. Hence, Au bump plating is carried out satisfactorily. In addition, the fourth embodiment is advantageous in safety since the plating solution is held in the closed space and vapor of the plating solution 322 does not flow outside the apparatus.

Figure 10:
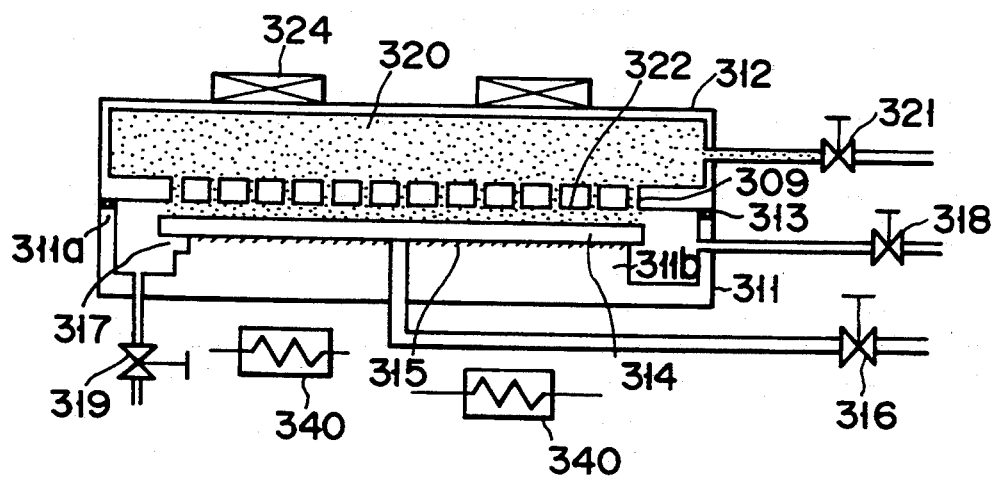
FIG. 10 is a crosssectional view schematically showing a substrate treatment apparatus according to a fifth embodiment of the present invention.

FIG. 10 is a crosssectional view showing a substrate treatment apparatus according to a fifth embodiment of the present invention. The apparatus of this embodiment is adapted for use mainly in development of a wafer. This embodiment differs from the fourth embodiment shown in FIG. 9 in that a temperature controller 340 for controlling the temperature of the wafer 314 is provided in place of the heating lamp 325. A developer is used as a treatment liquid 322. The direct current power source 323 and the plating electrodes 315 are not provided.

In the fifth embodiment, since the developer can instantaneously cover a surface of the wafer, uniform development is achieved without a nonuniformity of the developer. Further, even if the wafer 314 is larger than 200 mm in diameter, uniform development can be also achieved without any problem. If a treatment liquid 322 wherein Al or the like is dissolved in a saturated solution of $H_2SiF_6$ is used instead of developer, an $SiO_2$ film can be deposited on the wafer 314. In this case, the deposition is performed at a high rate without abnormal deposition since only the wafer 314 can be heated to 60° to 80° C.

FIG. 11 is a crosssectional view schematically showing a substrate treatment apparatus according to a sixth embodiment of the present invention. The apparatus of this embodiment is suitable for treatment using a silane coupling agent, which is used to adhere photoresist to a wafer. A number of through holes 341 are formed in the plane of a treatment liquid holder 312, which faces a wafer. The lower surface of the holder 312 is covered by a porous member 351 so that only vapor of the silane coupling agent can pass therethrough. The porous member 351 may be made of paper, cloth, or porous material formed of carbon, ceramic, etc.

The silane coupling agent may be suitably diluted and then directly applied to a wafer. However, it can be applied to a wafer by vapor deposition, in which case the vapor in the space in the holder 312 is applied through the through holes 341 and the porous member 351 to the wafer. According to the sixth embodiment, no particles are produced since the silane coupling agent is not applied to the rear surface of the wafer.

FIG. 12 is a crosssectional view showing a substrate treatment apparatus according to a seventh embodiment of the present invention. The apparatus of the seventh embodiment is suitable for treatments such as photoresist application, etc. A wafer supporting chuck 411 is rotatable and movable upward and downward. The chuck 411 comprises a fixing means such as a vacuum chuck. The apparatus also comprises a holder 413 for holding the photoresist above the supporting chuck 411 and a space which can store the photoresist. A resist supplying mechanism 414 communicates with the space. The plane of the holder 413 facing the wafer 412 has a porous member 416. The porous member 416 is made of, for example, a Teflon sheet.

A treatment of applying the photoresist to the wafer by means of the apparatus shown in FIG. 12 will now be described. First, the wafer 412 is fixed on the wafer supporting chuck 411. The wafer 412 is brought near the porous member 416 filled with the photoresist 415 by moving the chuck 411 upwardly without contacting with the member 416. In this state, the photoresist 415 is transferred from the porous member 416 to wafer 412, thereby forming the resist layer on the wafer 412. Thereafter, the wafer supporting chuck 411 with the wafer 412 disposed thereon is moved downward and stopped, then rotated slowly. As a result, superfluous resist 415 is scattered. Thus, a resist layer of a desired thickness is formed on the wafer 412.

According to the seventh embodiment, since the holder 413 positioned above the wafer 412 holds a large amount of photoresist 415 and thus the resist solvent volatilizes from the photoresist 415, the atmosphere surrounding the wafer 412 is full of the resist solvent when the wafer 412 is rotated and the superfluous photoresist is scatttered. Hence, the resist on the wafer 412 hardly dries, and the resist layer of a desired thickness can be obtained by rotation at a low speed. Moreover, the amount of resist used in the treatment is ⅓ to 1/10 that required in the conventional treatment apparatus. However, if the resist solvent concentration in the atmosphere surrounding the wafer 412 remains high for a long period of time, the photoresist 415 does not dry at all and a resist layer of an uniform thickness cannot be obtained. To prevent this, when the resist layer of a desired thickness is obtained, the wafer supporting chuck 411 is moved further downward to separate from the holder 413, thereby decreasing the resist solvent concentration in the atmosphere surrounding the wafer 412. Needless to say, the apparatus shown in FIG. 12 is also applicable for a treatment using a silane coupling agent and a development treatment.

FIG. 13 is a crosssectional view showing a substrate treatment apparatus according to a eighth embodiment of the present invention. The apparatus of the eighth embodiment is suitable for treating a large-sized substrate such as a glass plate for use in a liquid display device. A glass substrate 511 is disposed on and can be transferred by a substrate transfer roller 512. An endless belt 513 made of cloth resistant to a treatment liquid is positioned above the substrate 511, and can be rotated by a plurality of rollers 514 for rotating the belt. The endless belt 513 may be formed of, for example, Teflon paper, or mesh or cloth of so-called engineering plastic fiber such as polyamide and polyether ketone. The treatment apparatus of this embodiment also comprises a treatment liquid supplying mechanism 515 for supplying a treatment liquid to the cloth belt. The endless belt 513, the roller 514 for rotating the belt, and the treatment liquid supplying mechanism 515 constitute a treatment liquid holder 516, which is placed in proximity to the substrate 511, so that the main surface of the substrate touches the treatment liquid 523. The treatment is performed while the substrate 511 is moving. A cleaning mechanism 517 removes the excessive treatment liquid 523 remaining on the surface of the substrate after the treatment is completed. The cleaning mechanism 517 is constituted by a water supplying portion 519 for supplying water to the central portion of the mechanism and a low-pressured collecting portion 520 for collecting the used water and the remaining treatment liquid. The water supplying portion 519 includes a porous member 521 at the distal end for controlling the amount of water to clean the substrate surface. The apparatus of the embodiment further comprises a wiper mechanism 522 formed of cloth having water absorption properties to remove remaining water from the substrate. If necessary, a drying mechanism may be further provided with this embodiment, a large substrate 511 can be efficiently treated with a small amount of treatment liquid.

With the treatment apparatus and method of the present invention, a substrate is treated efficiently and safely with a small amount of treatment fluid without producing contaminant from the rear surface of the substrate.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of treating a substrate having a treatment surface by using a treatment liquid holding means having a surface and defining a plurality of holes in the surface, the method comprising the steps of:
   placing the surface of said holding means in parallel with the treatment surface;
   adjusting a distance between said treatment surface and the surface of said holding means to form a space therebetween;
   filling said space with a treatment liquid and keeping said treatment liquid only on said treatment surface by utilizing a surface tension of said treatment liquid to prevent an overflow of said treatment liquid from said treatment surface; and
   treating said substrate with said treatment liquid to give desired treatments to said treatment surface of said substrate.

2. A method according to claim 1, wherein the filling step includes the substep of injecting said treatment liquid through said holes to said space.

3. A method according to claim 1, wherein the filling step includes the substep of dropping said treatment liquid on holding means.

4. A method according to claim 1, wherein said treatment liquid holding means is immersed in said treatment liquid so as to fill said through holes with said treatment liquid.

5. A method according to claim 1, wherein the filling step includes the substep of supplying said treatment liquid to said holding means from a liquid storage means.

6. A method according to claim 2, wherein the pressure of said treatment liquid is controlled through said holes by a pressure control mechanism.

7. A method according to claim 1, wherein the temperature of said treatment liquid is controlled by heating means provided near said treatment liquid holding means.

8. A method according to claim 1, further including a step of applying a vibration to said treatment liquid so as to accelerate a spread of said treatment liquid on said treatment surface.

9. A method according to claim 1, wherein said space is formed on a portion of said treatment surface of said substrate and said treatment liquid is brought into contact with the entire surface area of said treatment surface by sliding said treatment liquid holding means.

10. A method according to claim 1, wherein said treatment liquid is a film-removing liquid, said method further comprising the step of removing a film from said treatment surface.

11. A method according to claim 1, wherein said treatment liquid is a plating solution, said method further comprising the step of plating said treatment surface.

12. A method according to claim 1, wherein said treatment liquid is a developer, said method further comprising the step of developing said treatment surface.

13. A method according to claim 1, wherein said treatment liquid is a cleaning solution, and said method further comprising the step of cleaning said treatment surface.

14. An apparatus for treating a substrate having a treatment surface comprising:
   means for holding said substrate;
   means for causing a treatment liquid to be maintained only on said treatment surface by utilizing a surface tension of said treatment liquid, the causing means including a surface adapted to face the treatment surface to form a space therebetween; and
   means for supplying said treatment liquid to said space.

15. An apparatus for treating a substrate according to claim 14, wherein said causing means defines a plurality of holes in a plane opposing said treatment surface, and said treatment liquid is supplied from said supplying means to said treatment surface through said holes.

16. An apparatus for treating a substrate according to claim 14, further comprising means for storing said treatment liquid, the storing means being located such that the causing means is between the storing means and the substrate.

17. An apparatus for treating a substrate according to claim 14, wherein said causing means is bendable.

18. An apparatus for treating a substrate according to claim 14, wherein said causing means includes an endless belt that moves in proximity to said substrate, said belt includes means for supplying said treatment liquid.

19. An apparatus for treating a substrate according to claim 14, wherein a plane of said liquid holding means which faces said substrate has a number of blind holes.

20. An apparatus for treating a substrate according to claim 14, wherein a plane of said liquid causing means which faces said substrate has projections arranged at predetermined intervals for adjusting a space between said plane and said substrate.

21. A method of treating a substrate having a treatment surface by using a liquid holding means having a surface and defining a plurality of holes in the surface, the method comprising the steps of:
   bringing the surface of the holding means and the treatment surface into mutual opposition to define a space between the surface of the holding means and the treatment surface, the space including a space distance between the surface of the holding means and the treatment surface;

filling the space with a treatment liquid; and treating said substrate with said treatment liquid to give desired treatments to said treatment surface of said substrate, wherein the space distance is sufficiently small such that the treatment liquid is constrained from flowing off of the treatment surface.

22. A method of claim 21, wherein the filling step includes the substep of passing the treatment liquid through the holes into the space.

23. A method according to claim 21, wherein the filling step includes the substep of controlling a pressure of the treatment liquid by a pressure control mechanism.

24. A method according to claim 21, further including the step of vibrating the treatment liquid.

25. A method according to claim 21, further including the step of sliding the member relative to the treatment surface.

26. An apparatus for treating a substrate having a treatment surface, the apparatus comprising:

a liquid holding means having a surface and defining a plurality of holes in the surface;

means for bringing the surface of the holding means in opposition to the treatment surface to define a space between the surface of the holding means and the treatment surface, the space having a first distance between the surface of the holding means and the treatment surface; and means for supplying a treatment liquid to the space, wherein the first distance is sufficiently small such that the treatment liquid is constrained from flowing off of the treatment surface.

27. An apparatus for treating a substrate according to claim 26, wherein the holding means includes a belt that is adapted to move parallel to the treatment surface.

28. An apparatus for treating a substrate according to claim 26, further including means for passing the liquid through the holes into the space.

29. An apparatus for treating a substrate according to claim 26, wherein the apparatus is adapted to receive a substrate having a surface and a second distance across the surface, wherein a ratio between the second distance and the first distance is equal to or greater than 170.

30. An apparatus for treating a substrate according to claim 26, wherein the diameter of the holes is a second distance, wherein a ratio between the second distance and the space distance is equal to or greater than 1.5.

31. An apparatus for treating a substrate according to claim 26, wherein the apparatus is adapted to receive a substrate having two surfaces and a second distance between the two surfaces, wherein the first distance is less than the second distance.

* * * * *